(12) United States Patent
Hsieh et al.

(10) Patent No.: US 9,690,411 B2
(45) Date of Patent: Jun. 27, 2017

(54) TOUCH DISPLAY

(71) Applicant: InnoLux Corporation, Miao-Li County (TW)

(72) Inventors: Hong-Sheng Hsieh, Miao-Li County (TW); Jian-Cheng Chen, Miao-Li County (TW); Shusaku Naito, Miao-Li County (TW); Ayumu Mori, Miao-Li County (TW); Keiko Edo, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/398,807

(22) Filed: Jan. 5, 2017

(65) Prior Publication Data

US 2017/0115788 A1  Apr. 27, 2017

Related U.S. Application Data

(63) Continuation of application No. 14/695,701, filed on Apr. 24, 2015, now Pat. No. 9,582,097.

(60) Provisional application No. 61/994,227, filed on May 16, 2014.

(30) Foreign Application Priority Data

Jul. 31, 2014 (TW) .............................. 103126148 A

(51) Int. Cl.
*G06F 3/041* (2006.01)
*G02F 1/1333* (2006.01)
*G02F 1/1335* (2006.01)
*G02F 1/1343* (2006.01)
*G02F 1/1368* (2006.01)
*H01L 27/32* (2006.01)

(52) U.S. Cl.
CPC .......... *G06F 3/0412* (2013.01); *G02F 1/1368* (2013.01); *G02F 1/13338* (2013.01); *G02F 1/133514* (2013.01); *G02F 1/133528* (2013.01); *G02F 1/134309* (2013.01); *H01L 27/322* (2013.01); *H01L 27/323* (2013.01); *H01L 27/3211* (2013.01); *G02F 2001/133302* (2013.01); *G02F 2001/134345* (2013.01); *G06F 2203/04102* (2013.01)

(58) Field of Classification Search
None
See application file for complete search history.

(56) References Cited

U.S. PATENT DOCUMENTS

2014/0152613 A1  6/2014 Ishizaki et al.

*Primary Examiner* — Nicholas Lee
(74) *Attorney, Agent, or Firm* — McClure, Qualey & Rodack, LLP

(57) ABSTRACT

A touch display includes a display panel and a touch layer. The display panel has pixel areas, and one of the pixel areas has a pixel pitch in a first direction. The display panel includes a substrate, and a display medium layer disposed over the substrate. The touch layer is disposed over the substrate, and includes slits and an electrode. The slits include a first slit and a second slit adjacent to the first slit. The electrode is disposed between the first slit and the second slit. The electrode includes first linear sections and second linear sections alternately arranged in a second direction.

19 Claims, 8 Drawing Sheets

TOUCH DISPLAY

CROSS-REFERENCE TO RELATED APPLICATIONS

The present application is a continuation application of and claims priority from U.S. patent application Ser. No. 14/695,701, filed on Apr. 24, 2015, which claims the benefit of and claims priority to U.S. Provisional Application No. 61/994,227, filed on May 16, 2014, and Taiwan Patent Application No. 103126148 filed on Jul. 31, 2014, the entireties of which are incorporated by reference herein.

BACKGROUND OF THE INVENTION

Field of the Invention

The present disclosure relates to a display apparatus and in particular to a touch display.

Description of the Related Art

Electronic apparatuses, such as mobile phones or tablet computers, have wildly utilized touch display as inputting interfaces. In general, the touch display comprises a display panel, and a touch layer and a color filter disposed over the display panel. The touch layer comprises a plurality of transparent electrodes arranged in an array and configured to detect the coordinates of a touch signal on the touch layer. The color filter comprises a plurality of pixels arranged in an array for displaying a color image.

The conventional transparent electrodes are overlaid on the pixels. When light beam passes through the color filters and the transparent electrodes, a moiré pattern may be generated in some images on the screens of the touch display by a moiré effect due to the arrangement of the conventional transparent electrodes and pixels. Therefore, the quality of the image on the touch displays is decreased.

BRIEF SUMMARY OF THE INVENTION

The present disclosure provides a touch display with a reduced moiré effect. Thus, a moiré pattern on the touch display is decreased.

The present disclosure provides a touch display including a display panel and a touch layer. The display panel has pixel areas, and one of the pixel areas has a pixel pitch in a first direction. The display panel includes a substrate, and a display medium layer disposed over the substrate. The touch layer is disposed over the substrate, and includes slits and an electrode. The slits include a first slit and a second slit adjacent to the first slit. The electrode is disposed between the first slit and the second slit. The electrode includes first linear sections and second linear sections alternately arranged in a second direction. The second direction is substantially perpendicular to the first direction. One of the first linear sections has an edge, and a first inflection point and a second inflection point are located at two ends of the edge.

An intersection point is defined as a crossing location of an extension of the first inflection point in the first direction and an extension of the second inflection point in the second direction. A first distance is defined as a distance between the first inflection point and the intersection point, and a second distance is defined as a distance between the second inflection point and the intersection point. A ratio of the second distance to the first distance is in a range from 0.33 to 3.05.

The present disclosure provides a touch display including a display panel and a touch layer. The display panel has pixel areas, and one of the pixel areas has a pixel pitch in the transverse direction. The display panel includes a substrate, and a display medium layer disposed over the substrate. The touch layer is disposed over the substrate. The touch layer includes slits including a first slit and a second slit adjacent to the first slit, and an electrode disposed between the first slit and the second slit.

A predetermined pitch is defined as a width of the electrode plus a width of the first slit, a first moiré ratio is defined as (the predetermined pitch/the pixel pitch)×100%, and the first moiré ratio complies with a first formula: $25\%+(50\%\times N)-A\% \leq$ the first moiré ratio $\leq 25\%+(50\%\times N)+A\%$. The N is 0 or a positive integer, and the A is an adjustment value in a range from 0 to 20.

The conducting-wire portions and the pixel areas are designed according to the formula of the present disclosure. The moiré effect of the touch display is decreased, and the moiré pattern of the images on the touch display is decreased.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
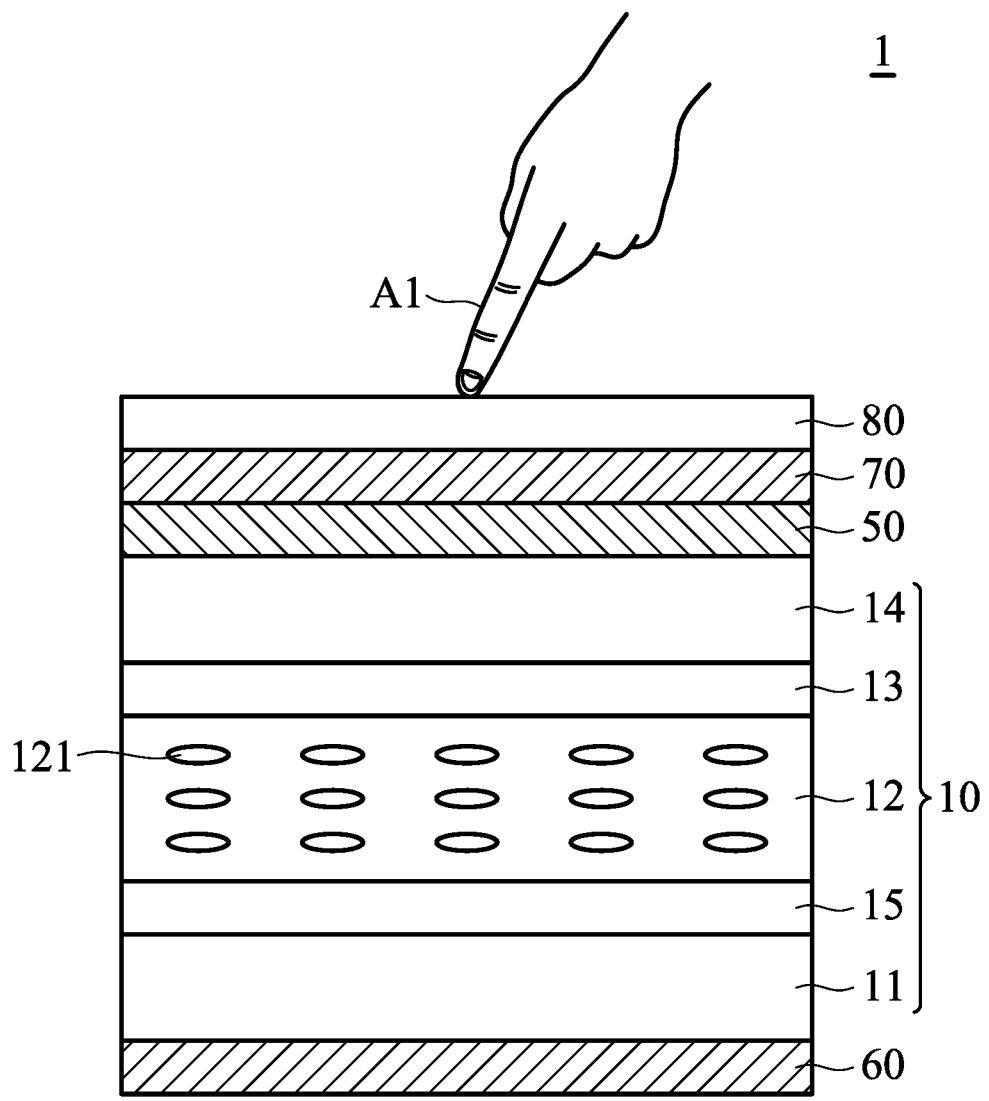
FIG. 1 is a schematic view of a touch display in accordance with the present disclosure.

FIG. 1 is a schematic view of a touch display 1 in accordance with the present disclosure. The touch display 1 comprises a display panel 10, a touch layer 50, a first polarizing layer (polarizing film) 60, a second polarizing layer 70 and a protective layer 80.

The display panel 10 comprises a first substrate 11, a display medium layer 12, a color-filter layer 13, a second substrate 14, and a thin-film transistor layer 15. The first substrate 11 is made from a transparent material, such as glass. The thin-film transistor layer 15 is disposed over the first substrate 11. The display medium layer 12 is disposed over the thin-film transistor layer 15, or disposed between the first substrate 11 and the second substrate 14.

The display medium layer 12 may be a liquid-crystal display layer or an organic light-emitting display. In the embodiment, the display medium layer 12 is a liquid-crystal display layer. The liquid-crystal display layer comprises liquid-crystal molecules 121, disposed over the thin-film transistor layer 15. The thin-film transistor layer 15 is configured to control the arrangement of the liquid-crystal molecules 121 in the display medium layer (liquid-crystal layer) 12. In the embodiment, the liquid-crystal molecules 121 are homogeneous alignment liquid crystals. In some embodiments, the liquid-crystal molecules 121 are vertical alignment liquid crystals or twisted nematic liquid crystals according to the design of the display panel 10.

The color-filter layer 13 is disposed over the display medium layer 12. The color-filter layer 13 is disposed between the display medium layer 12 and the second substrate 14, or disposed between the display medium layer 12 and the touch layer 50. The color-filter layer 13 is configured to transform the color of the light beam passing through the color-filter layer 13. In another embodiment, the color-filter layer 13 is disposed over the first substrate 11.

Figure 2:
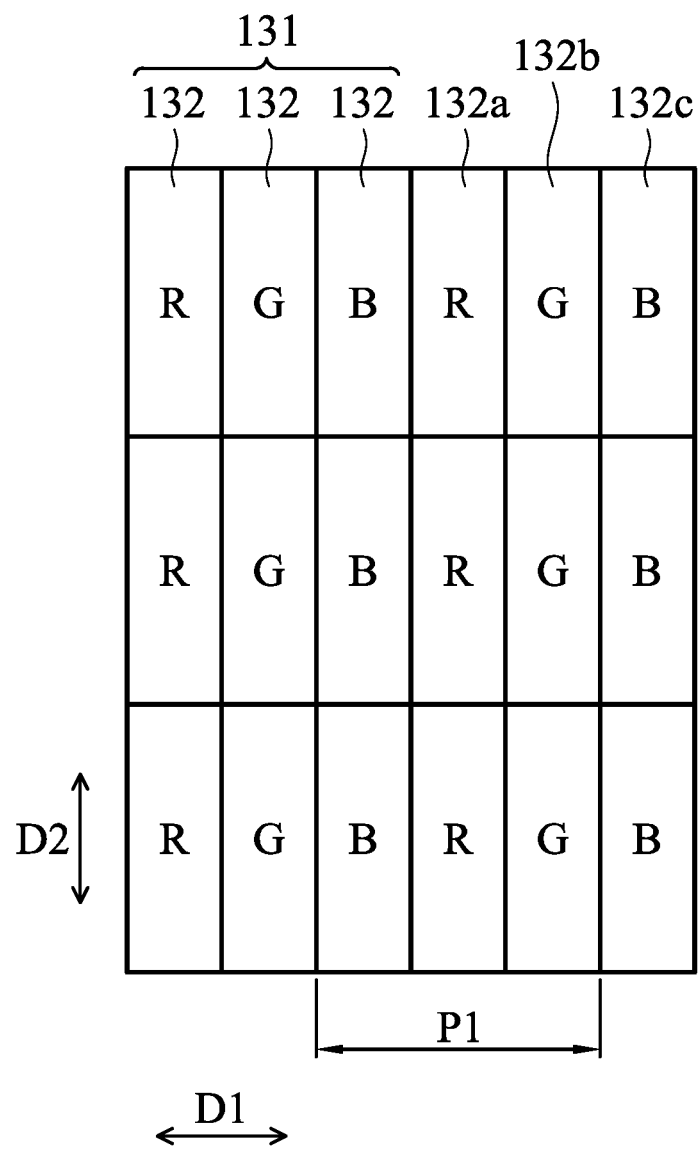
FIG. 2 is a schematic view of a display zone of the display panel in accordance with the present disclosure.

FIG. 2 is a schematic view of a display zone of the display panel 10 in accordance with the present disclosure. As shown in FIG. 2, the display zone comprises a plurality of pixel areas 131. The pixel areas 131 are arranged in an array. Each of the pixel areas 131 comprises a plurality of sub-pixels 132. The sub-pixels 132 in the pixel area 131 correspond to the color filters with different colors in the color-filter layer 13. The light beam presents different colors after the light beam passes through the sub-pixels 132 corresponding to the different color filters.

For example, the pixel area 131 of display panel 10 comprises a red sub-pixel 132a, a green sub-pixel 132b, and a blue sub-pixel 132c. The red sub-pixel 132a corresponds to red color filter, the green sub-pixel 132b corresponds to green color filter, and the blue sub-pixel 132c corresponds to blue color filter. The red sub-pixel 132a, the green sub-pixel 132b, and the blue sub-pixel 132c are repeatedly arranged along the transverse direction D1 in sequence, or arranged by other suitable designs.

When a light beam (ex. white light) emitted by a backlight unit (not shown) passes through the red sub-pixel 132a, the light beam is transformed to red. When the white light passes through the green sub-pixel 132b, the white light is transformed to green. When the white light passes through the blue sub-pixel 132c, the white light is transformed to blue. In some embodiments, the pixel area 131 of the display panel 10 comprises a red, a blue, a green, and a white sub-pixel, or a red, a blue, a green, and a yellow sub-pixel.

The second substrate 14 is made of a transparent material, such as glass. In some embodiments, the second substrate 14 is a transparent flexible substrate. The second substrate 14 is disposed over the display medium layer 12. The second substrate 14 is disposed over the color-filter layer 13.

The touch layer 50 is configured to generate a touch signal according to detect a touch event. For example, the touch event is triggered by a touch element A1 touching the protective layer 80. In some embodiments, the touch element A1 is a finger or a touch sensing pen. The touch layer 50 is disposed over the second substrate 14 and under the protective layer 80. The touch layer 50 is also disposed over the first substrate 11, or disposed between the first substrate 11 and the second substrate 14. In another embodiment, the touch layer 50 is disposed between the color-filter layer 13 and the display medium layer 12.

The first polarizing layer 60 is disposed under the first substrate 11, and the second polarizing layer 70 is disposed over the touch layer 50. The first polarizing layer 60 and the second polarizing layer 70 are configured to polarize the light beam passing through the first polarizing layer 60 and the second polarizing layer 70. In other words, the display medium layer 12, the color-filter layer 13, the second substrate 14, the thin-film transistor layer 15, the touch layer 50, and the second polarizing layer 70 are disposed between the first substrate 11 and the protective layer 80.

The protective layer 80 is made from transparent material, such as glass, to protect the elements inside the touch display 1. In other embodiments, the second polarizing layer 70 has a function, such as a scratch-proofing function or a dirt-proofing function, since the second polarizing layer 70 servers as a protective layer. When a touch element A1 touches the protective layer 80, a touch event is triggered. The touch layer 50 detects the touch event and generates a touch signal according to the touch event, and thus the location of the touch is calculated and distinguished.

Figure 3:
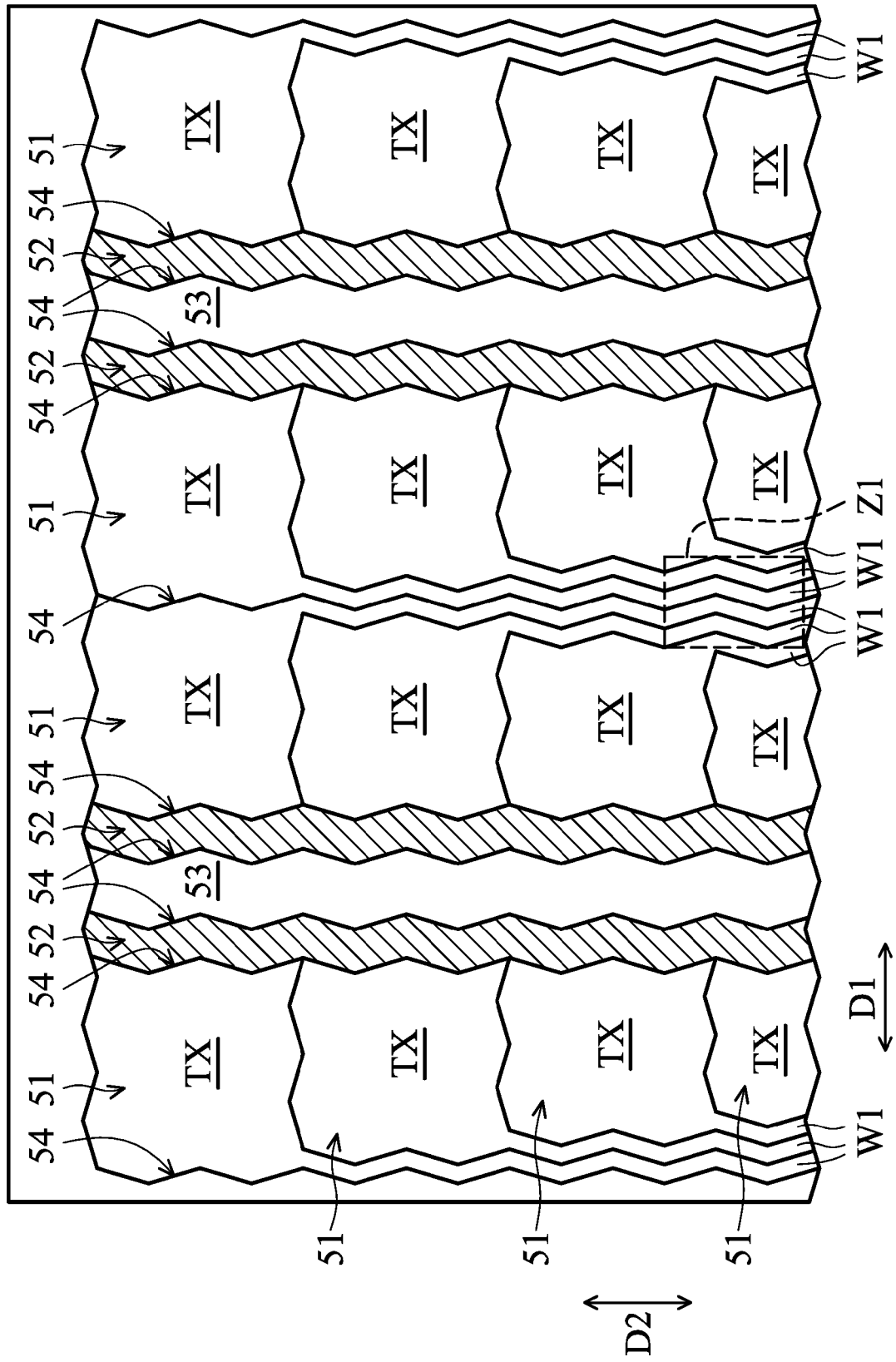
FIG. 3 is a schematic view of a touch layer in accordance with a first embodiment of the present disclosure.

FIG. 3 is a schematic view of a touch layer 50 in accordance with a first embodiment of the present disclosure. The touch layer 50 comprises a plurality of transmission electrodes 51, a plurality of sensing electrodes 52, a plurality of ground electrodes 53, and a plurality of slits 54. The transmission electrode 51 comprises a transmission portion TX and a conducting-wire portion W1. The conducting-wire portion W1 is configured to connect a signal source (not shown in figures) and the transmission portion TX.

In the embodiment, the ground electrode 53 is configured to ground the sensing electrodes 52. The electrical potential of the ground electrode 53 is about zero. In some embodiments, the ground electrodes 53 are excluded from the touch layer 50.

In some embodiments, the touch layer 50 further comprises dummy electrodes (not shown in figures) between the transmission electrodes 51 and the sensing electrodes 52 (or the ground electrode 53). The dummy electrodes are not connected to any electrical potential, and the electrical potential of the dummy electrodes is floating and not fixed.

The transmission electrode 51, the sensing electrode 52, and the ground electrode 53 are separated by the slits 54. The slits 54 pass through the electrode zones with different electrical potential, such as the transmission electrodes 51, the sensing electrodes 52, and the ground electrodes 53. The transmission electrode 51, the sensing electrode 52, the ground electrode 5 or a portion of one of the electrodes is between two adjacent slits 54.

The transmission portion TX and the conducting-wire portion W1 of the transmission electrode 51, the sensing electrode 52, and the ground electrode 53 are made from transparent conductive material, such as indium tin oxide (ITO) or indium zinc oxide (IZO). The conducting-wire portion W1 of the transmission electrode 51 is made from a metal material.

A plurality of transmission electrodes 51 extend along a longitudinal direction D2 and adjacent to the sensing electrode 52. The sensing electrode 52 and the ground electrode 53 extend along the longitudinal direction D2. The longitudinal direction D2 is substantially perpendicular to the transverse direction D1. The ground electrode 53 is disposed between two sensing electrodes 52. In another embodiment, the ground electrode 53 is excluded from the touch layer 50. The two adjacent sensing electrodes 52 in FIG. 3 are integrated into one.

The transmission portions TX are substantially arranged along the longitudinal direction D2, and adjacent to the sensing electrode 52. The conducting-wire portion W1 is connected to a part of the transmission portion TX, and extends along the longitudinal direction D2. When the touch element A1 contacts the protective layer 80 and is disposed over the transmission portion TX and the sensing electrode 52, the transmission electrode 51 generates a driving signal.

In some embodiments, the areas of the transmission portions TX are the same, gradually decreased, or gradually increased along the longitudinal direction D2. In the embodiment, as shown in FIG. 3, the areas of the transmission portions TX are gradually decreased along the longitudinal direction D2. The conducting-wire portions W1 are separated from each other and arranged along the transverse direction D1.

In the transverse direction D1, the number of conducting-wire portions W1 is increased from a side of the touch layer 50 to an opposite side of the touch layer 50, as shown in FIG. 3. The conducting-wire portions W1 and the slits 54 are alternately arranged in a moiré zone Z1, as shown in FIG. 3, for example.

The brightness of the light beam passing through the slits 54 are different from the brightness of the light beam passing through the transmission electrodes 51, the sensing electrodes 52 and the ground electrodes 53, since the transmittance of the slits 54 is different form the transmittance of the transmission electrodes 51, the sensing electrodes 52 and the ground electrodes 53. Especially, in the moiré zone Z1, the conducting-wire portions W1 and the slits 54 are densely arranged. Alternating bright and shade lines extending along the longitudinal direction D2 are shown when a light beam passes through the moiré zone Z1.

Moreover, since the pixel areas 131 are arranged in an array, the image shown in the touch display 1 has a moiré pattern by the moiré effect when the touch layer 50 and the color-filter layer 13 are overlapped. When the moiré effect is great, the change of the moiré pattern shown on the image generated by the touch display 1 is great.

In the embodiment, the conducting-wire portions W1 and the slits 54 are arranged in an appropriate way to decrease the moiré effect. As shown in FIG. 2, the pixel area 131 comprises a pixel pitch P1 in the transverse direction D1. As shown in FIG. 2, in the embodiment, the red, blue and green sub-pixels 132 are disposed in the pixel area 131. In another embodiment, the red, green, blue and yellow sub-pixels 132 are disposed in the pixel area 131.

Figure 4:
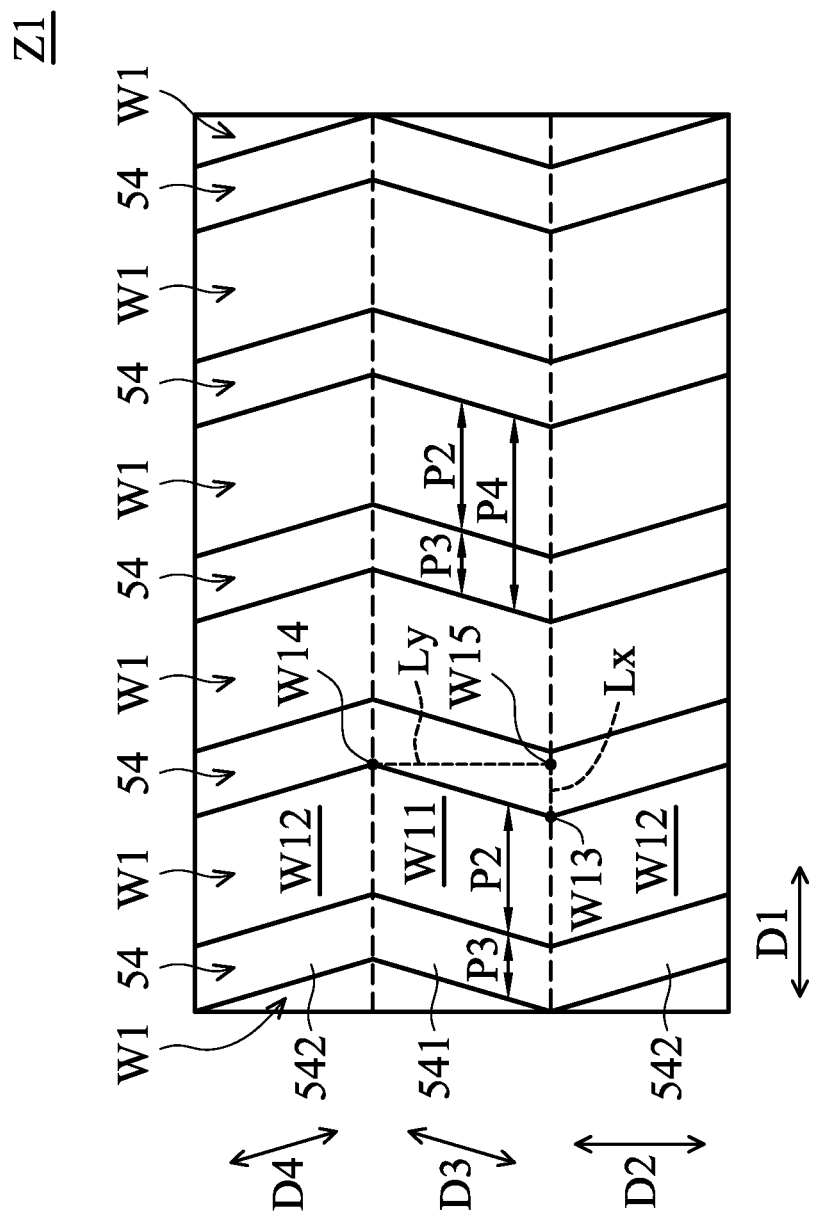
FIG. 4 is a moiré zone of the touch layer in accordance with a first embodiment of the present disclosure.

FIG. 4 is a moiré zone Z1 of the touch layer 50 in accordance with a first embodiment of the present disclosure. The conducting-wire portion W1 has a wire pitch P2 in the transverse direction D1. The slit 54 has a slit pitch P3 in the transverse direction D1. The predetermined pitch P4 is defined as the wire pitch P2 of the conducting-wire portions W1 plus the slit pitch P3 of the slit 54. In other words, one of the conducting-wire portions W1 and its adjacent slit 54 have a predetermined pitch P4 in the transverse direction D1. In one embodiment, the predetermined pitch P4 is defined as a width of one of the conducting-wire portions W1 plus a width of its adjacent slit 54.

A moiré ratio is defined as (the predetermined pitch P4/the pixel pitch P1)×100%. The moiré ratio complies with the formula (1) as follows:

$$25\% + (50\% \times N) - A\% \leq \text{the moiré ratio} \leq 25\% + (50\% \times N) + A\% \quad \text{formula (1)}$$

In the formula (1), N is 0 or a positive integer. In other embodiments, N is in a range from about 0 to 8. A is an adjustment value in a range from about 0 to 20, or 0 to 15. The range of the adjustment value is adjusted according to the tolerance range of the parameters of the manufacturing process.

For example, when both N and A are 0, the moiré ratio is 25%. When the pixel pitch P1 is 100 um, the predetermined pitch P4 is 25 um. Therefore, in the moiré zone Z1, each of the relative overlapping positions of the pixel areas 131 and the conducting-wire portions W1 may be different in the transverse direction D1 since the conducting-wire portions W1 in the moiré zone Z1 are designed according to the moiré ratio in the formula (1). Therefore, the moiré effect is decreased, and the moiré pattern is decreased or less obvious. Moreover, for example, when N is 1 and A is 0, the moiré ratio is 75%. When N is 1 and A is 1, the moiré ratio is in a range from 74% to 76%.

When the conducting-wire portions W1 are designed and arranged according to the range of the moiré ratio mentioned above, the moiré effect of the touch display 1 is decreased.

As shown in FIG. 4, in the embodiment, the slit 54 is a wave shape. The slit 54 comprises a plurality of segments 541 and 542. The segments 541 and 542 may be linear structures. The segments 541 may be substantially parallel to each other, and the segments 542 may be substantially parallel to each other. The segments 541 and 542 are alternately arranged in substantially a longitudinal direction D2. The segments 541 substantially extend along a first extension direction D3, and the segments 542 substantially extend along a second extension direction D4.

The conducting-wire portion W1 is a conductive layer. The conductive layer is made from transparent conductive material or metal. The conducting-wire portion W1 is disposed between two adjacent slits 54, and the conducting-wire portion W1 is wave-shaped structure. The moiré effect of the touch display 1 is decreased by the wave-shaped slits 54 and conducting-wire portions W1.

The conducting-wire portion W1 comprises a plurality of linear sections W11 and a plurality of linear sections W12. The linear sections W11 and W12 may be a line structures. The linear sections W11 are substantially parallel to each other, and the linear sections W12 are substantially parallel to each other. The linear sections W11 and W12 are alternately arranged in substantially a longitudinal direction D2. The linear sections W11 substantially extends along the first extension direction D3, and the linear sections W12 substantially extends along the second extension direction D4. A first acute angle is between the first extension direction D3 and the longitudinal direction D2. A second acute angle is between the second extension direction D4 and the longitudinal direction D2. The first acute angle may be the same as or different from the second acute angle.

An inflection point W13 and an inflection point W14 are disposed at two ends of an edge of the linear section W11. The linear section W12 is connected to the inflection point W13 and the inflection point W14. The intersection point W15 is disposed at a crossing location of the extension of the inflection point W13 in the transverse direction D1 and the extension of the inflection point W14 in the longitudinal direction D2. Transverse distance Lx is defined as the distance between the inflection point W13 and the intersection point W15, and longitudinal distance Ly is defined as the distance between the inflection point W14 and the intersection point W15.

The value of the longitudinal distance Ly/transverse distance Lx is in a range from 0.33 to 3.05. In another embodiment, the value of the longitudinal distance Ly/transverse distance Lx is in a range from 0.4 to 2.50, or from 0.45 to 2.15. When the value of longitudinal distance Ly/transverse distance Lx complies with the described range, the moiré effect that occurs in the moiré zone Z1 is decreased.

An arrangement ratio is defined as (transverse distance Lx/pixel pitch P1)×100% or (longitudinal distance Ly/pixel pitch P1)×100%. The value of the arrangement ratio complies with formula (2):

$$25\% + (50\% \times N) - B\% \leq \text{the arrangement ratio} \leq 25\% + (50\% \times N) + B\% \quad \text{formula (2)}$$

N is 0 or a positive integer. In some embodiments, N is in a range from 0 to 8. B is an adjustment value in a range from 0 to 20 or 0 to 15. The range of the adjustment value, B, may be adjusted according to the tolerance range of the parameters of the manufacturing process. When the conducting-wire portions W1 are designed and arranged in the range of the moiré ratio, the moiré effect is decreased.

For example, when N is 1 and the B is 0, the arrangement ratio is about 75%. When N is 1 and B is 1, the arrangement ratio is in a range from about 74% to 76%. For example, when the pixel pitch P1 is about 100 um, the transverse distance Lx or the longitudinal distance Ly is in a range from about 74 um to 76 um.

Figure 5:
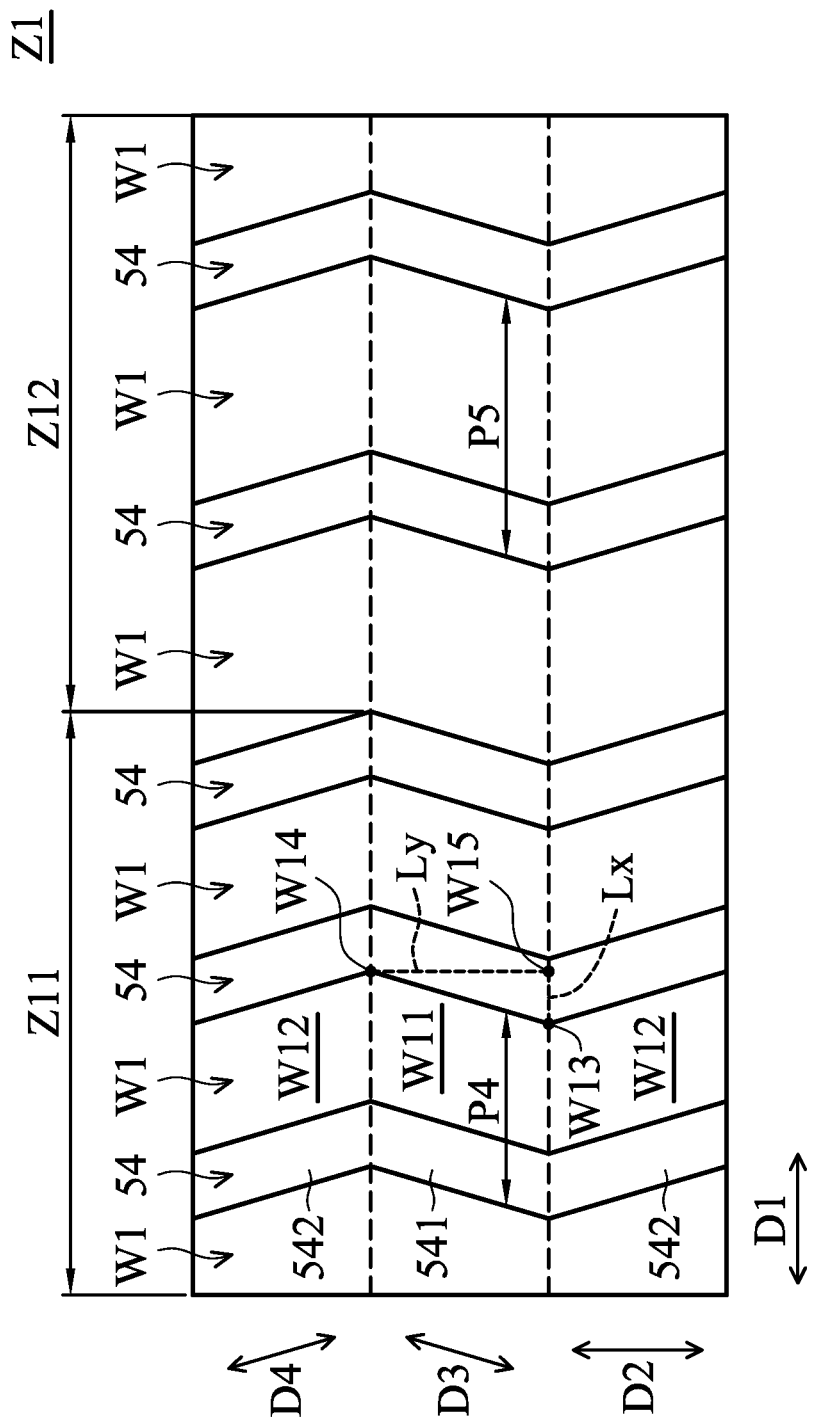
FIG. 5 is a schematic view of a moiré zone of the touch layer in accordance with a second embodiment of the present disclosure.

FIG. 5 is a schematic view of a moiré zone Z1 of the touch layer 50 in accordance with a second embodiment of the present disclosure. The moiré zone Z1 further comprises a first zone Z11 and a second zone Z12 adjacent to the first zone Z11. In some embodiments, the moiré zone Z1 comprises at least three zones.

The first zone Z11 and the second zone Z12 are arranged along the transverse direction D1. The arrangement of the conducting-wire portions W1 in the first zone Z11 are designed according to the formula (1). The arrangement of the conducting-wire portions W1 in the second zone Z12 are designed according to the formula (3):

$$25\% + (50\% \times (N+1)) - A\% \leq \text{the moiré ratio} \leq 25\% + (50\% \times (N+1)) + A\% \quad \text{formula (3)}$$

N in formula (3) is 0 or a positive integer. In some embodiments, N is in a range from 0 to 8. A is an adjustment value. The range of the adjustment value, A, may be adjusted according to the tolerance range of the parameters of the manufacturing process. The A is in a range from 0 to 20, or 0 to 15. The moiré ratio corresponding to the first zone Z11 complies with the formula (1), and the moiré ratio corresponding to the second zone Z12 complies with formula (3). Therefore, the predetermined pitches in the moiré zone Z1 may be different. In the embodiment, the predetermined pitch P4 of the first zone Z11 is smaller than the predetermined pitch P5 of the second zone Z12. When the conducting-wire portions W1 in the first zone Z11 and the second zone Z12 are designed according to the formula (3), the moiré effect of the moiré zone Z1 is decreased.

Figure 6:
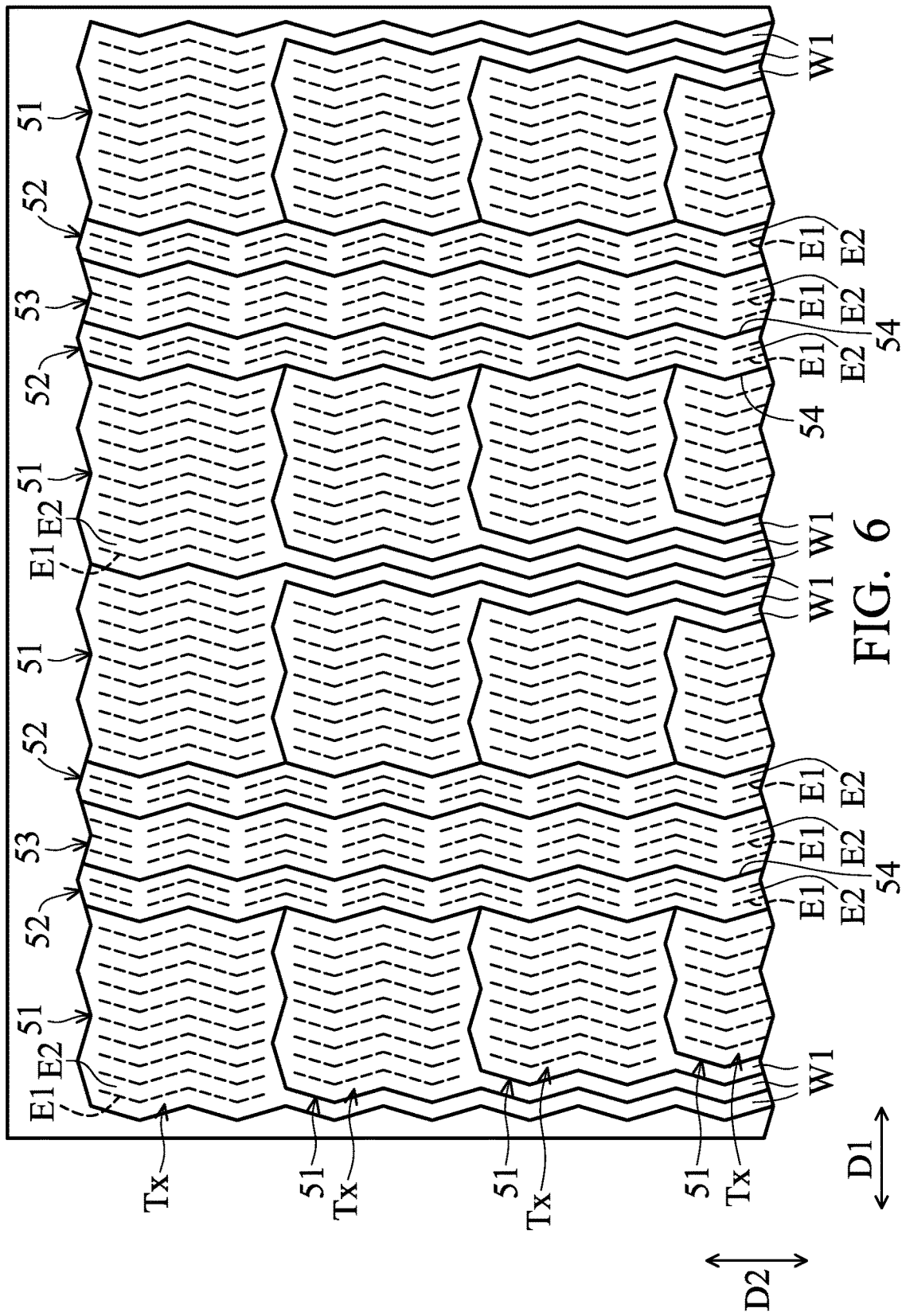
FIG. 6 is a schematic view of a touch layer in accordance with a second embodiment of the present invention.

FIG. 6 is a schematic view of a touch layer 50 in accordance with a second embodiment of the present invention. In the embodiment, a plurality of dummy slits E1 may be disposed in the transmission portion TX, the sensing electrode 52, and the ground electrode 53 to further decrease the moiré effect. One of the electrodes E2 is disposed between two adjacent dummy slits E1.

The dummy slit E1 is a wave-shaped structure extending along the longitudinal direction D2. In the embodiment, the shape of the dummy slit E1 corresponds to the shape of the slit 54. However, in some embodiments, the shape of the dummy slit E1 may not correspond to the shape of the slit 54. The dummy slits E1 may have different shapes according the requirements of the design of the touch display 1. In the embodiment, two ends of the dummy slit E1 are not connected to the slit 54 at the same time. In other words, the dummy slit E1 is distributed at one electrode zone having the same electrical potential. In other words, the electrodes around the dummy slit E1 having the same electrical potential. Some arrangements of the dummy slit E1 may refer to the arrangements of the slit 54.

One of the electrodes E2 is disposed between the slit 54 and its adjacent dummy slit E1. The electrode E2 is a wave-shaped structure extending along the longitudinal direction D2. The design of the electrode E2 may refer to the conducting-wire portion W1. The electrode E2 may be a portion of the transmission portion TX or the conducting-wire portions W1 of the transmission electrode 51. The electrode E2 may be a portion of the sensing electrode 52, the ground electrode 53 or the dummy electrode.

Figure 7:
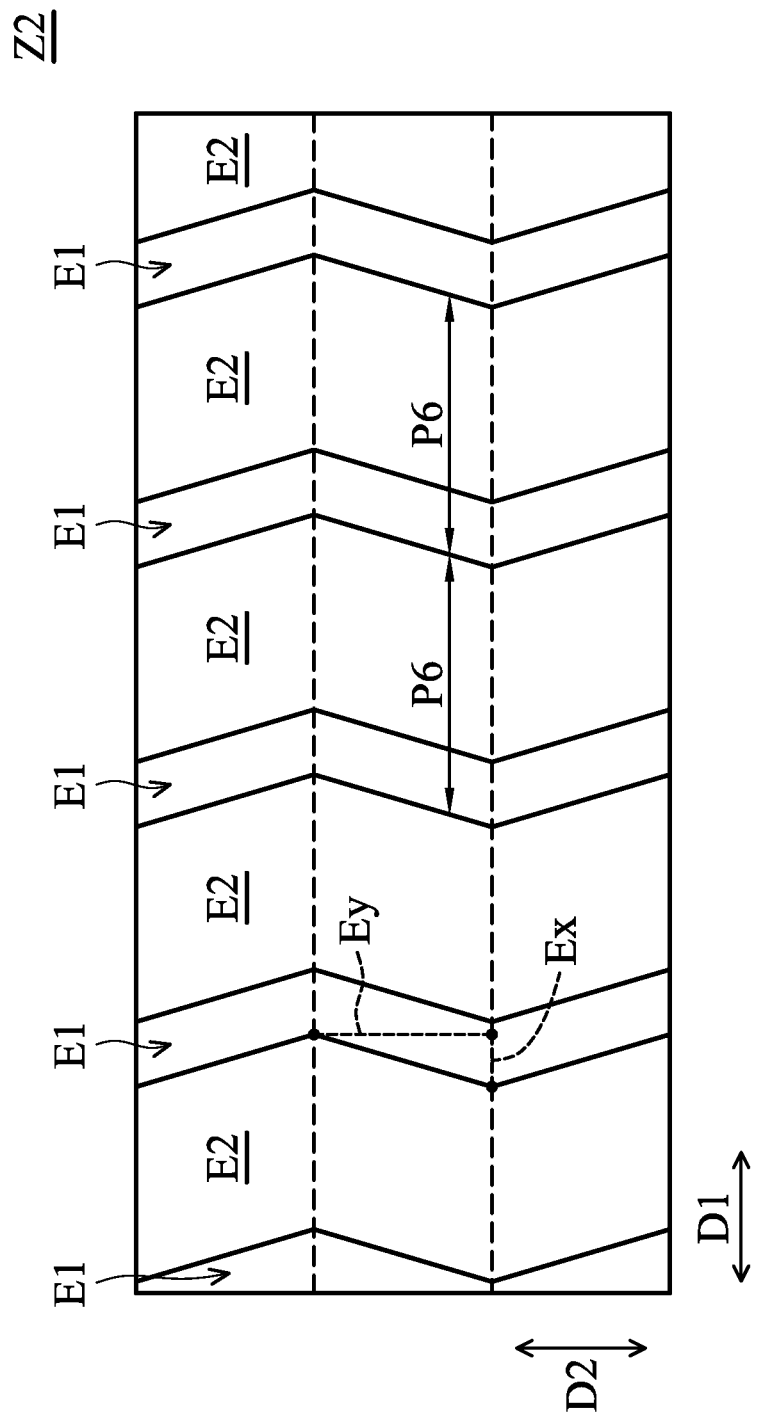
FIG. 7 is a schematic view of the moiré zone of the touch layer in accordance with a third embodiment of the present disclosure.

FIG. 7 is a schematic view of the moiré zone Z2 of the touch layer 50 in accordance with a third embodiment of the present disclosure. As shown in FIG. 7, the dummy slits E1 and the electrodes E2 are in a moiré zone Z2. Each of the dummy slits E1 and its adjacent electrode E2 have a dummy predetermined pitch P6 in a transverse direction D1. In other words, a dummy predetermined pitch P6 in a transverse direction D1 is defined as a width of one of the dummy slits E1 plus a width of its adjacent electrode E2. The moiré ratio is defined as (dummy predetermined pitch P6/pixel pitch P1) 100%. Therefore, in the embodiment, the dummy predetermined pitch P6 corresponding to the electrode E2 corresponds to the predetermined pitch P4 defined by formula (1). In other words, the moiré ratio complies with formula (1).

The value of the longitudinal distance Ey/the transverse distance Ex of the electrode E2 is in a range from 0.33 to 3.05. In another embodiment, the value of the longitudinal distance Ey/the transverse distance Ex is in a range from 0.4 to 2.50, or from 0.45 to 2.15. When the value of longitudinal distance Ey/transverse distance Ex is in the range mentioned above, the moiré effect in the moiré zone Z1 is decreased. Moreover, the arrangement ratio of the electrode E2 complies with the formula (2).

In conclusion, the pattern of the touch layer and the pixel areas are designed according to the formula of the present disclosure, the moiré effect of the touch display is decreased, and the moiré pattern of the images is decreased.

Figure 8:
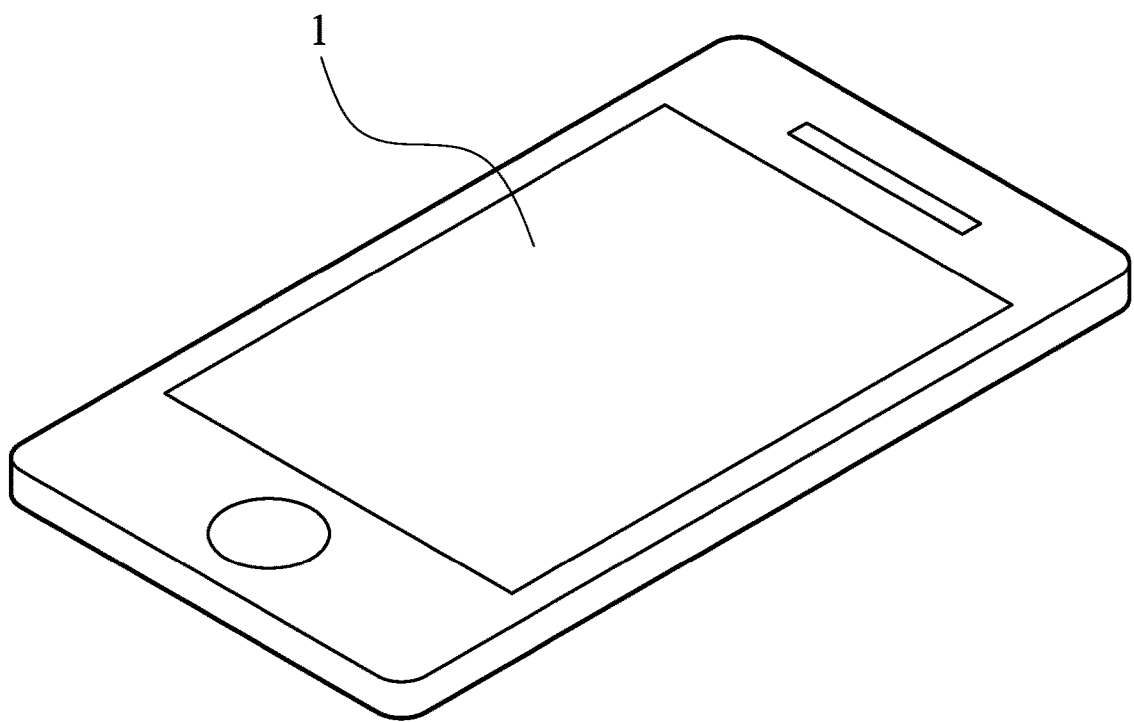
FIG. 8 is a schematic view of a touch apparatus in accordance with the present disclosure.

In some embodiments, the touch display 1 of the described disclosures can be applied to various electronic apparatuses, such as touch apparatuses. FIG. 8 is a schematic view of a touch apparatus 100 in accordance with the present disclosure. The touch apparatus 100 comprises the touch display 1 configured to display images and provide touch functions. In some embodiments, the touch apparatus 100 is a mobile phone, a tablet computer, a curved mobile phone, a curved tablet computer, or other suitable apparatuses. In some embodiments, the touch apparatus 100 is a flexible touch apparatus, or other suitable apparatuses.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch display, comprising:
   a display panel, having a plurality of pixel areas, wherein one of the pixel areas has a pixel pitch in a first direction, and the display panel comprises:
   a substrate; and
   a display medium layer, disposed over the substrate;
   a touch layer disposed over the substrate, the touch layer comprising;
   a plurality of slits, wherein the slits comprise a first slit and a second slit adjacent to the first slit; and
   an electrode disposed between the first slit and the second slit, wherein the electrode comprises a plurality of first linear sections and a plurality of second linear sections alternately arranged in a second direction, the second direction is substantially perpendicular to the first direction, one of the first linear sections has an edge, and a first inflection point and a second inflection point are located at two ends of the edge, wherein an intersection point is defined as a crossing location of an extension of the first inflection point in the first direction and an extension of the second inflection point in the second direction, a first distance is defined as a distance between the first inflection point and the intersection point, and a second distance is defined as a distance between the second inflection point and the intersection point, wherein a ratio of the second distance to the first distance is in a range from 0.33 to 3.05.

2. The touch display as claimed in claim 1, wherein the substrate is a transparent flexible substrate.

3. The touch display as claimed in claim 1, wherein the touch display is applied as a flexible touch apparatus.

4. The touch display as claimed in claim 1, wherein the display medium layer is an organic light-emitting display layer.

5. The touch display as claimed in claim 1, wherein the value of the second distance/the first distance is in a range from 0.4 to 2.50.

6. The touch display as claimed in claim 1, further comprising a color-filter layer disposed over the substrate, wherein the touch layer is disposed between the color-filter layer and the substrate, or the color-filter layer is disposed between the touch layer and the substrate.

7. A touch display, comprising:
a display panel having a plurality of pixel areas, wherein one of the pixel areas has a pixel pitch in the transverse direction, and the display panel comprises:
a substrate; and
a display medium layer disposed over the substrate; and
a touch layer disposed over the substrate, and the touch layer comprising:
a plurality of slits comprising a first slit and a second slit adjacent to the first slit; and
wherein a predetermined pitch is defined as a width of the electrode plus a width of the first slit, a first moiré ratio is defined as (the predetermined pitch/the pixel pitch)× 100%, and the first moiré ratio complies with a first formula:

$$25\% + (50\% \times N) - A\% \leq \text{the first moiré ratio} \leq 25\% + (50\% \times N) + A\%,$$

wherein the N is 0 or a positive integer, and the A is an adjustment value in a range from 0 to 20.

8. The touch display as claimed in claim 7, wherein the substrate is a transparent flexible substrate.

9. The touch display as claimed in claim 7, wherein the touch display is applied as a flexible touch apparatus.

10. The touch display as claimed in claim 7, wherein the display medium layer is an organic light-emitting display layer.

11. The touch display as claimed in claim 7, wherein the electrode is a portion of the transmission electrode, a portion of the sensing electrode, a portion of the dummy electrode, or a portion of the ground electrodes.

12. The touch display as claimed in claim 7, wherein the A is in a range from 5 to 15, or the N is in a range from 0 to 8.

13. The touch display as claimed in claim 7, wherein the electrodes is distributed in a first zone and a second zone adjacent to the first zone, the first moiré ratio corresponds to the first zone, and the electrode of the second zone has a second moiré ratio, wherein the second moiré ratio complies with a second formula:

$$25\% + (50\% \times (N+1)) - A\% \leq \text{the second moiré ratio} \leq 25\% + (50\% \times (N+1)) + A\%.$$

14. The touch display as claimed in claim 7, wherein the electrode is a wave-shaped structure, the electrode comprises a linear section, two ends of an edge of each of the linear sections have a first inflection point and a second inflection point, an intersection point is disposed at a crossing location of an extension of the inflection point in the transverse direction and an extension of the inflection point in the longitudinal direction, wherein a transverse distance is defined as a distance between the first inflection point and the intersection point, and a longitudinal distance is defined as a distance between the second inflection point and the intersection point.

15. The touch display as claimed in claim 14, wherein an arrangement ratio complies with a third formula:

$$25\% + (50\% \times N) - B\% \leq \text{the arrangement ratio} \leq 25\% + (50\% \times N) + B\%,$$ wherein the N is 0 or a positive integer, and the B is an adjustment value in a range from 0 to 20, wherein the arrangement ratio is defined as (the longitudinal distance/the pixel pitch)×100%.

16. The touch display as claimed in claim 15, wherein B is in a range from 5 to 15, or the N is in a range from 0 to 8.

17. The touch display as claimed in claim 14, wherein the value of the longitudinal distance/the transverse distance is in a range from 0.33 to 3.05.

18. The touch display as claimed in claim 17, wherein the value of the longitudinal distance/the transverse distance is in a range from 0.4 to 2.50.

19. The touch display as claimed in claim 7, further comprising a color-filter layer disposed over the substrate, wherein the touch layer is disposed between the color-filter layer and the substrate, or the color-filter layer is disposed between the touch layer and the substrate.

* * * * *

UNITED STATES PATENT AND TRADEMARK OFFICE
CERTIFICATE OF CORRECTION

PATENT NO. : 9,690,411 B2
APPLICATION NO. : 15/398807
DATED : June 27, 2017
INVENTOR(S) : Hsieh et al.

Page 1 of 1

It is certified that error appears in the above-identified patent and that said Letters Patent is hereby corrected as shown below:

In the Claims

At Column 9, Line 41 in Claim 7, Line 11, please insert:
-- an electrode disposed between the first slit and the second slit, --

Signed and Sealed this
Eighth Day of May, 2018

Andrei Iancu
*Director of the United States Patent and Trademark Office*